United States Patent
Wils et al.

(10) Patent No.: US 6,642,103 B2
(45) Date of Patent: Nov. 4, 2003

(54) SEMICONDUCTOR DEVICE AND METHOD OF MANUFACTURING THE SAME

(75) Inventors: Nicole Anne Helena Freddy Wils, Eindhoven (NL); Michiel Slotboom, Eindhoven (NL); Franciscus Petrus Widdershoven, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 16 days.

(21) Appl. No.: 09/980,510

(22) PCT Filed: Mar. 5, 2001

(86) PCT No.: PCT/EP01/02432

§ 371 (c)(1),
(2), (4) Date: Nov. 2, 2001

(87) PCT Pub. No.: WO01/67517

PCT Pub. Date: Sep. 13, 2001

(65) Prior Publication Data

US 2002/0137290 A1 Sep. 26, 2002

(30) Foreign Application Priority Data

| Mar. 8, 2000 | (EP) | 00200831 |
| May 31, 2000 | (EP) | 00201929 |
| Oct. 13, 2000 | (EP) | 00203561 |

(51) Int. Cl.[7] .......................... H01L 21/336
(52) U.S. Cl. ...................... 438/257; 438/267
(58) Field of Search ................... 438/257, 259, 438/266, 267, 270, 301, 311, 332, 448, 689, 691, 706, 745, 738, 954

(56) References Cited

U.S. PATENT DOCUMENTS

| 5,429,969 A | * | 7/1995 | Chang ................ 438/267 |
| 5,494,838 A | * | 2/1996 | Chang et al. ........ 438/257 |
| 5,607,871 A | | 3/1997 | Han ..................... 437/43 |
| 6,489,650 B2 | * | 12/2002 | Kumazaki ............ 257/318 |

* cited by examiner

Primary Examiner—David Nhu
(74) Attorney, Agent, or Firm—Aaron Waxler

(57) ABSTRACT

A semiconductor device includes a semiconductor body (1) which is provided at a surface (2) with a non-volatile memory cell comprising a source (3) and a drain (4), and an access gate (14) which is electrically insulated from a gate structure (8) comprising a control gate (9), the gate structure (8) being electrically insulated from the semiconductor body (1) by a gate dielectric (11,25). The gate dielectric (11,25) is provided with a charge-storage region wherein data in the form of electric charge can be stored. The access gate (14) has a substantially flat surface portion (17) extending substantially parallel to the surface (2) of the semiconductor body (1) and has the shape of a block which is disposed against the gate structure (8) without overlapping the gate structure (8).

6 Claims, 8 Drawing Sheets

SEMICONDUCTOR DEVICE AND METHOD OF MANUFACTURING THE SAME

FIELD OF THE INVENTION

The invention relates to a semiconductor device comprising a semiconductor body which is provided at a surface with a non-volatile memory cell.

BACKGROUND OF THE INVENTION

Such a semiconductor device is known from U.S. Pat. No. 5,607,871. In the known semiconductor device, to non-volatile memory cell comprises a source and a drain, and an access gate which is electrically isolated from a gate structure comprising a control gate. The gate structure is electrically insulated from the semiconductor body by a gate dielectric which is provided with a floating gate acting as a charge-storage region wherein data in e form of electric charge can be stored. The access gate has a substantially flat surface portion extending substantially parallel to the surface of the semiconductor body. The access gate is provided by a patterned polysilicon layer which overlaps the gate structure as well as an adjacent gate structure and stretches out to substantially beyond the outermost side walls of the gate structures. In between the gate structures, the patterned polysilicon layer is disposed above the drain, which is locally provided in the semiconductor body. The source is provided in the semiconductor body, while being aligned to the patterned polysilicon layer.

A disadvantage of the known semiconductor device is that, owing to the large topography at the location of the gate structures and, hence, of a polysilicon layer applied on top of these gate structures, photolithographic patterning of the polysilicon layer is difficult. When a photoresist layer formed on top of the polysilicon layer is exposed to light so as to form a resist pattern, the exposed light is reflected in oblique directions on the surface of the polysilicon layer. As a consequence, the resist pattern is deformed, resulting in a poor dimensional accuracy of the patterned polysilicon layer. As the patterned polysilicon layer is disposed above the drain, other disadvantages of the known semiconductor device are that the source and the drain cannot be formed in a single step and that cross-talk takes place between the patterned polysilicon layer and the drain during operation of the memory cell.

The above-described non-volatile memory cell comprises an access transistor and a floating gate transistor, which floating gate transistor comprises a floating gate whereon data in the form of electric charge can be stored. As is well known to those skilled in the art, a so-called charge trapping transistor can be used instead of the above-mentioned floating gate transistor. Such a charge trapping transistor comprises a control gate which is electrically insulated from the semiconductor body by a gate dielectric, which gate dielectric comprises a distribution of mutually separated trapping centers wherein electric charge can be stored. In such a charge trapping transistor, electric charge cannot only be provided throughout the length of the channel but also only on the source side of the channel or only on the drain side of the channel. Since these different conditions can be distinguished in the reading process, it is possible to store two bits per memory cell.

Whether a floating gate is used for charge storage, as is the case in the known semiconductor device, or a gate dielectric comprising mutually separated trapping centers makes no difference with regard to the above-mentioned disadvantages. These disadvantages also occur in a semiconductor device with a charge trapping transistor.

SUMMARY OF THE INVENTION

The invention has for its object inter alia to provide a semiconductor device with a non-volatile memory cell, which memory cell can be manufactured more easily and more accurately, and which enables the earlier-mentioned problem of cross-talk during operation to be counteracted.

The semiconductor device in accordance with the invention comprises a semiconductor body which is provided at a surface with a non-volatile memory cell comprising a source and a drain, and an access gate which is electrically insulated from a gate structure comprising a control gate, the gate structure being electrically insulated from the semiconductor body by a gate dielectric, which is provided with a charge-storage region wherein data in the form of electric charge can be stored, and the access gate having a substantially flat surface portion extending substantially parallel to the surface of the semiconductor body and having the shape of a block which is disposed against the gate structure without overlapping the gate structure. When the access gate is formed by means of photolithographic patterning of a conductive layer, light, which is emitted to pattern an overlying photoresist layer, will not be reflected in oblique directions on the surface of the conductive layer. Hence, the access gate can be formed with a larger dimensional accuracy. Furthermore, the source and the drain can be formed in a single step by using the gate structure together with the access gate as a mask. In this way, cross-talk between the drain and (the conductive layer providing) the access gate can be counteracted.

The charge-storage region may be formed, for example, by a floating gate. In another embodiment, the charge-storage region comprises a distribution of mutually separated trapping centers. The gate dielectric provided with the distribution of mutually separated trapping centers may, for example, be a silicon oxide layer with contaminations, for example metal particles, distributed therein, the contaminations providing the trapping centers. However, a more widespread way is the use of a gate dielectric comprising a double layer of two different materials which form a border layer supplying the mutually separated trapping centers. In order to increase the compatibility with standard CMOS processing, the double layer is advantageously formed by a layer of silicon oxide and an adjacent layer of silicon nitride.

In a further embodiment of the semiconductor device in accordance with the invention, the substantially flat surface portion of the access gate is located at substantially the same height as the top surface portion of the gate structure. In this way, the combined structure of gate structure and access gate is substantially flat.

If the non-volatile memory cell comprises one access gate, which memory cell is also referred to as two-transistor (2T) cell, the access gate is advantageously provided at the side of the gate structure adjacent to the source. If an access transistor is provided at the side of the source, the programming voltage necessary for switching is lower than the programming voltage necessary for switching when the access transistor is provided at the side of the drain, so that the former access transistor can be processed with a thinner gate dielectric.

Further advantageous embodiments of the semiconductor device in accordance with the invention are described in the dependent claims.

The invention further relates to a method of manufacturing a semiconductor device comprising a semiconductor body which is provided at a surface with a non-volatile memory cell.

Such a method is known from U.S. Pat. No. 5,607,871. In the known method, the semiconductor body is provided with a drain in between a gate structure and an adjacent gate structure, prior to the application of a conductive layer, i.e. a polysilicon layer. The polysilicon layer is subsequently patterned in such a way that it overlaps the gate structure as well as the adjacent gate structure and stretches out to substantially beyond the outermost side walls of these gate structures. After patterning of the polysilicon layer, the semiconductor body is provided with a source, which is aligned to the patterned polysilicon layer.

A disadvantage of this method is that, owing to the large topography at the location of the gate structures and, hence, of the polysilicon layer applied on top of these gate structures, photolithographic patterning of the polysilicon layer is difficult. When a photoresist layer formed on top of the polysilicon layer is exposed to light so as to form a resist pattern, the exposed light is reflected on the surface of the polysilicon layer in oblique directions. As a consequence, the resist pattern is deformed, resulting in a poor dimensional accuracy of the patterned polysilicon layer. As the patterned polysilicon layer is disposed above the drain, other disadvantages of the above method are that the source and the drain cannot be formed in a single step and that cross-talk takes place between the patterned polysilicon layer and the drain during operation of the memory cell.

The above-mentioned disadvantages of a method of manufacturing a semiconductor device with a floating gate transistor also occur in a method of manufacturing a semiconductor device with a charge trapping transistor.

The invention has for its object inter alia to provide a method of manufacturing a semiconductor device with a non-volatile memory cell, which method can be carried out more easily and more accurately and enables the above-mentioned problem of cross-talk during operation to be counteracted.

In the method in accordance with the invention, a gate structure comprising a control gate is formed at the surface of the semiconductor body, the gate structure being electrically insulated from the semiconductor body by a gate dielectric, which gate dielectric is provided with a charge-storage region wherein data in the form of electric charge can be stored, after which a conductive layer is applied in a thickness such that the upper surface of the conductive layer next to the gate structure is located at substantially the same height as, or higher than, the top surface portion of the gate structure, which conductive layer is removed over a part of its thickness by means of a planarizing treatment until the gate structure is exposed, after which the conductive layer is patterned, while using a mask in order to provide an access gate, which mask stretches out from the gate structure over a region of the conductive layer adjoining the gate structure. At the moment that the conductive layer is provided with the mask, the conductive layer has a substantially flat surface. Hence, when the mask is applied by depositing a photoresist layer, which photoresist layer is patterned by means of exposure to light, the light is not reflected in oblique directions on the surface of the conductive layer. Hence, the access gate can be formed with a larger dimensional accuracy. Furthermore, the source and the drain can be formed in a single step by using the gate structure together with the access gate as a mask. In this way, cross-talk between the drain and (the conductive layer providing) the access gate can be counteracted.

Further advantageous embodiments of the method in accordance with the invention are described in the dependent claims.

BRIEF DESCRIPTION OF THE DRAWING

These and other aspects of the invention will be apparent from and be elucidated with reference to the embodiments described hereinafter and shown in the drawing. In the drawing.

DETAILED DESCRIPTION OF THE PRIMARY EMBODIMENT

Figure 1:
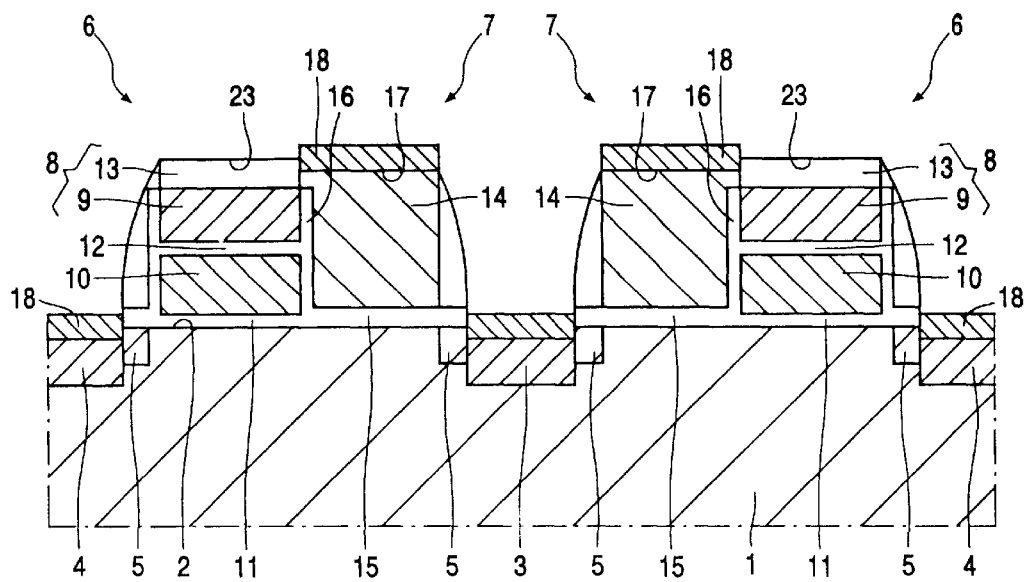
FIG. 1 shows a diagrammatic cross-sectional view of a first embodiment of adjacent non-volatile memory cells in accordance with the invention.
Figure 2:
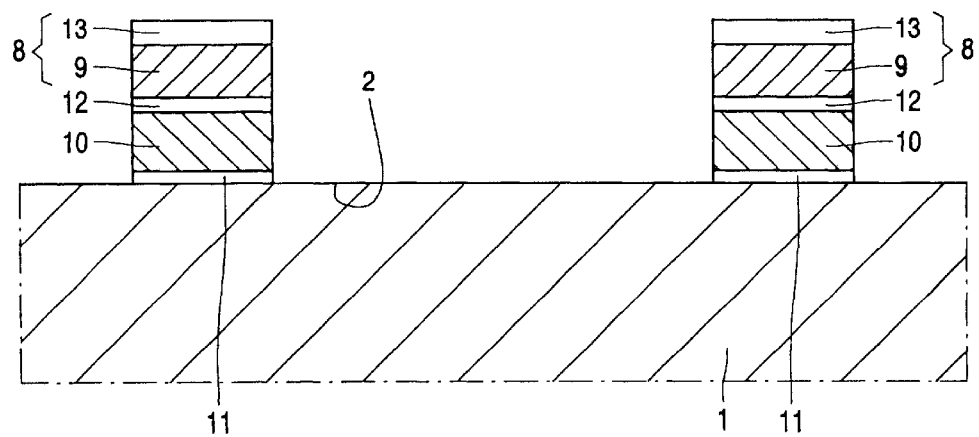
FIGS. 2 to 7 show diagrammatic cross-sectional views of successive stages in the manufacture of the adjacent non-volatile memory cells of FIG. 1 using the method in accordance with the invention.
Figure 3:
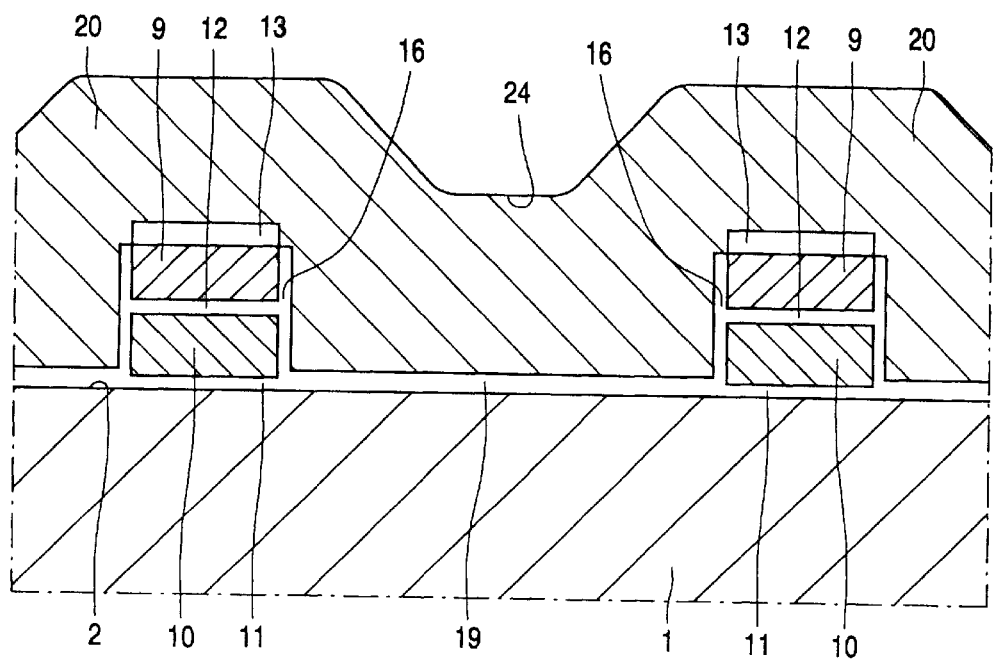

FIG. 1 shows a semiconductor body 1 of a first conductivity type, in the present example a silicon body of, for example, p-type conductivity. The semiconductor body 1 is provided at a surface 2 with non-volatile memory cells, which memory cells comprise a source 3 and a drain 4 of an opposite, second conductivity type, in the present example n-type conductivity. The source 3 and the drain 4 are provided with an extension 5 in the present example. In between the extended source 3,5 and the extended drain 4,5 of the memory cells, the surface 2 of the semiconductor body 1 is provided with a floating gate transistor 6 and an access transistor 7. The floating gate transistor 6 comprises a gate structure 8, which gate structure 8 in turn comprises a control gate 9. Between the gate structure 8 and the semiconductor body 1, a layer 10 of a conductive material is provided, which layer 10 of conductive material is surrounded on all sides by electrically insulating material and forms a floating gate. The floating gate 10 acts as a charge-storage region whereon data in the form of electrical charge can be stored. The floating gate 10 and the control gate 9 can be composed of, for example, polycrystalline silicon doped with, for example, phosphorus. Alternatively, amorphous silicon or $Si_xGe_{1-x}$ may be used for the floating gate 10 and the control gate 9, with x representing the fraction of silicon lying in the range between about 0.6 and 1. The floating gate 10 is insulated from the semiconductor body 1 by a floating gate dielectric 11 and from the control gate 9 by an inter-gate dielectric 12. Both the floating gate dielectric 11 and the inter-gate dielectric 12 can be composed of, for example, silicon oxide. Alternatively, floating gate dielectric 11 and the inter-gate dielectric 12 may be composed of a dielectric material whose dielectric constant is significantly higher than that of silicon oxide, such as tantalum oxide, aluminium oxide or silicon nitride. Other suitable materials for the inter-gate dielectric 12 are, for example, silicon oxynitride (SiON) and a sandwich of silicon oxide and silicon nitride (ONO). The gate structure 8 comprises an insulating layer 13 as the uppermost layer, which insulating layer 13 is advantageously composed of silicon nitride or silicon oxide. The access transistor 7 has an access gate 14, which is insulated from the semiconductor body 1 by a gate dielectric 15. The access gate 14 can be composed of, for example, polycrystalline silicon doped with, for example, phosphorus, amorphous silicon or $Si_xGe_{1-x}$ with x representing the fraction of silicon lying in the range between about 0.6 and 1. The gate dielectric 15 can be composed of, for example, silicon oxide, or a dielectric material whose dielectric constant is significantly higher than that of silicon oxide, such as tantalum oxide, aluminium oxide or silicon nitride. The access transistor 7 and, hence, the access gate 14 is electrically insulated from the gate structure 8 by an insulating material 16 such as, for example, silicon oxide or silicon nitride. The access gate 14 has the shape of a block which is disposed against the gate structure 8 without overlapping the gate structure 8. The access gate 14 has a substantially flat surface portion 17 extending substantially parallel to the surface 2 of the semiconductor body 1. The substantially flat surface portion 17 of the access gate 14, the source 3 and the drain 4 are provided with a metal suicide 18, for example a low ohmic phase of titanium silicide. In the present example, the substantially flat surface portion 17 of the access gate 14 is located at substantially the same height as the top surface portion 23 of the gate structure 8.

In the above described, non-volatile memory cell, the access gate 14 is provided at the side of the gate structure 8 adjacent to the source 3. Obviously, the access gate 14 may also be provided at the side of the gate structure 8 adjacent to the drain 4. Alternatively, the non-volatile memory cell may comprise two access gates instead of one, which access gates are provided at either side of the gate structure 8. A non-volatile memory cell with two access transistors is often referred to as three-transistor (3T) cell. The non-volatile memory cell can be part of a matrix of memory cells, which matrix is embedded in a CMOS or BICMOS integrated circuit, or can be part of a stand-alone non-volatile memory.

FIGS. 2 to 7 show diagrammatic cross-sectional views of successive stages in the manufacture of the adjacent non-volatile memory cells of FIG. 1 using the method in accordance with the invention.

The manufacture starts with the semiconductor body 1 of the first conductivity type (FIG. 2), in the present example a silicon body of, for example, p-type conductivity. The semiconductor body 1 is provided at the surface 2 with a stack comprising the floating gate dielectric 11, the floating gate 10, the inter-gate dielectric 12, and the gate structure 8, which gate structure 8 in turn comprises the control gate 9 and the insulating layer 13, the insulating layer 13 being the uppermost layer of the gate structure 8. This stack can be formed in a usual way by depositing the different layers and subsequently patterning these layers so as to form the stack.

In a next step (FIG. 3), the exposed parts of the surface 2 of the semiconductor body 1 are provided with a dielectric layer 19 providing the gate dielectric 15 of the access transistor 7 in a later stage of the process. Then, the side wall portions of the gate structure 8 are covered with the insulating material 16 in order to electrically insulate the access gate 14, which is to be provided in a later stage of the process, from the gate structure 8. Then, a conductive layer 20 is applied in a thickness such that the upper surface 24 of the conductive layer 20 next to the gate structure 8 is located at substantially the same height as, or higher than, the top surface portion 23 of the gate structure 8.

Figure 4:
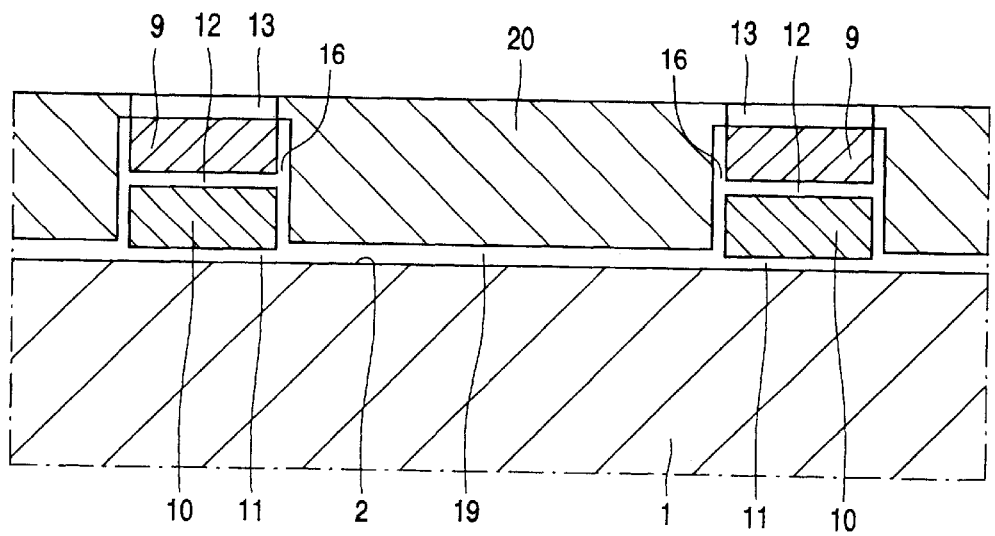
Figure 5:
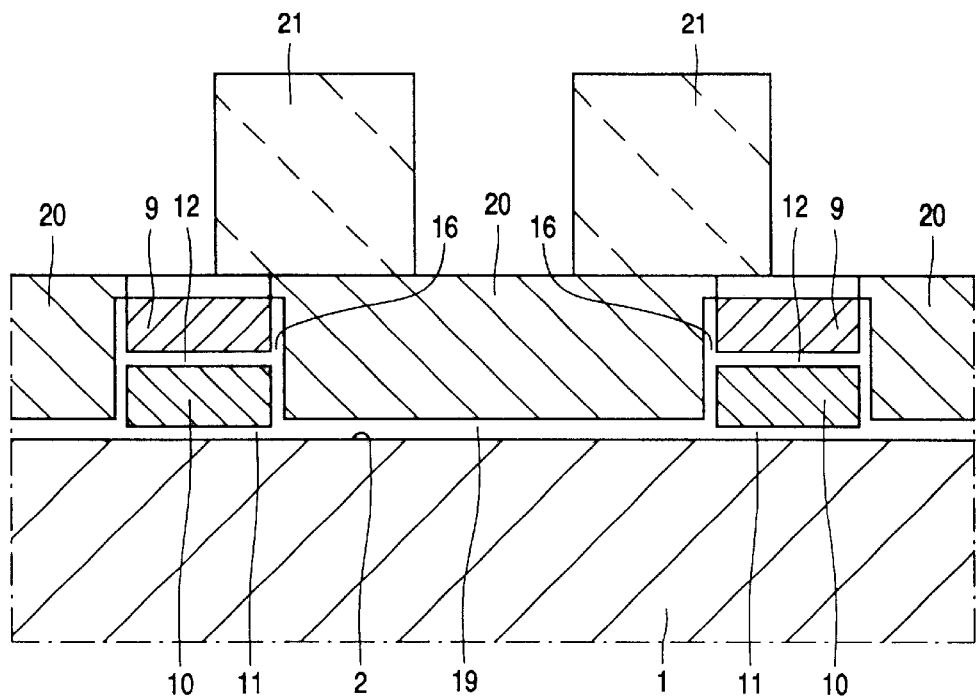
Figure 6:
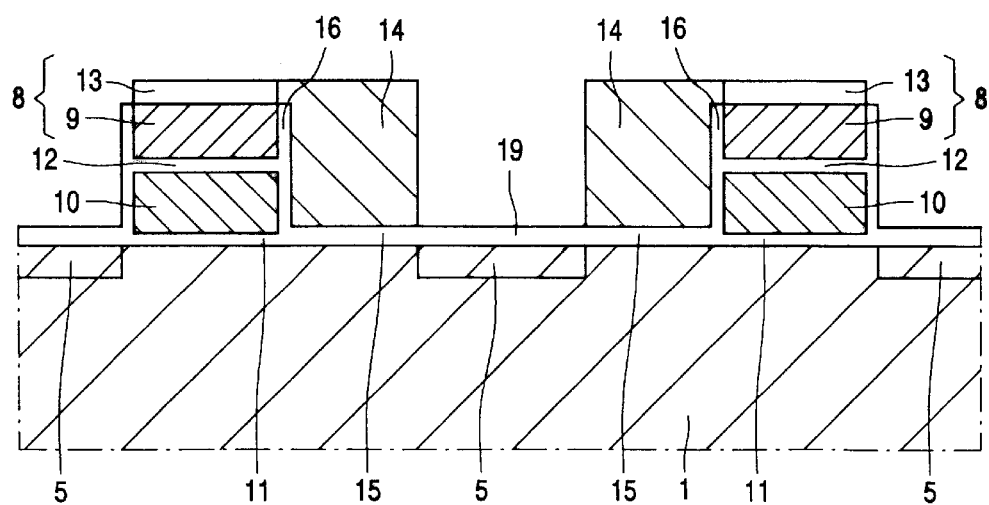

With reference to FIG. 4, the conductive layer 20 is removed over a part of its thickness by means of a planarizing treatment until the gate structure 8 is exposed. In order to accurately stop the planarizing treatment, the gate structure 8 advantageously comprises the insulating layer 13 as the uppermost layer, which insulating layer 13 is composed of a material having a larger resistance with respect to the planarizing treatment than the material used for the conductive layer 20. The insulating layer 13 acts as a stopping layer during the planarizing treatment. If polycrystalline silicon is applied for the conductive layer 20, the insulating layer 13 is advantageously composed of silicon oxide or silicon nitride. Chemical-mechanical polishing (CMP) is advantageously used to remove the conductive layer 20 over a part of its thickness. For this purpose a commercially available slurry can be used.

In a next step (FIG. 5), the conductive layer 20 is patterned, while using a mask 21 to provide the access gate 14 of the access transistor 7, which mask 21 stretches out from the gate structure 8 over a region of the conductive layer 20 adjoining the gate structure 8. The conductive layer 20 is advantageously patterned by means of photolithography. For that purpose, a photoresist layer is deposited on top of the conductive layer 20, which photoresist layer is patterned by means of exposure to light in order to form the mask 21, after which unmasked parts of the conductive layer 20 are removed. Owing to the substantially flat surface of the conductive layer 20 at the moment that the photoresist layer is patterned by means of exposure to light the light is not reflected in oblique directions on the surface of the conductive layer 20. Hence, the access gate 14 is formed with a relatively large dimensional accuracy (FIG. 6), the access gate 14 being insulated from the semiconductor body 1 by the gate dielectric 15, which gate dielectric 15 is provided by the dielectric layer 19. After formation of the access gate 14, the surface 2 of the semiconductor body 1 is provided with source/drain extensions 5 of the second, opposite conductivity type, in the present example n-type, by means of a self-aligned implantation of a relatively light dose of, for instance, phosphorus or arsenic using the gate structure 8 together with the access gate 14 as a mask.

Figure 7:
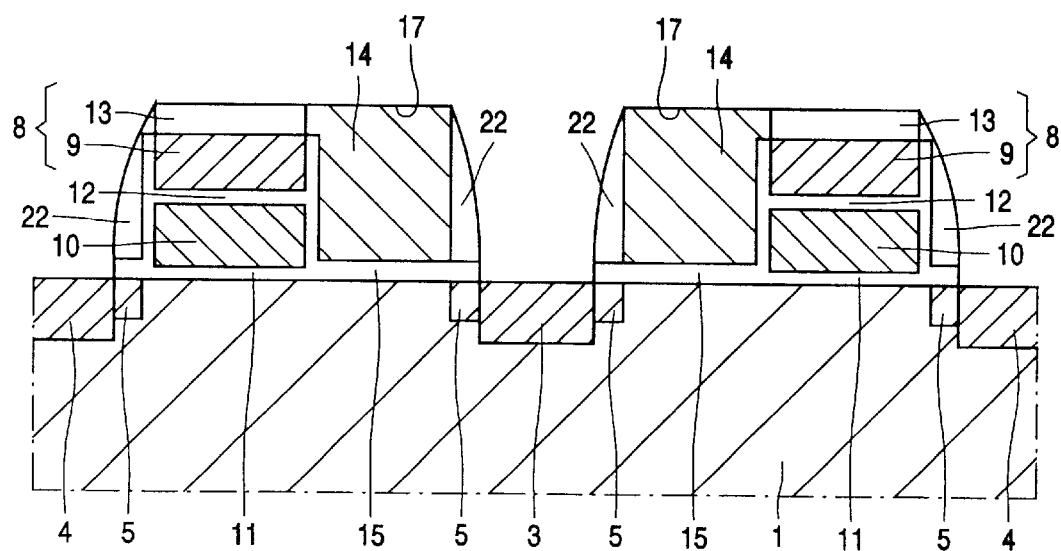

Subsequently, sidewall spacers 22 are formed e.g. in a known way, for example, by means of deposition and anisotropic etch-back of a silicon nitride layer or a silicon oxide layer (FIG. 7). After formation of the sidewall spacers 22, a highly-doped source 3 and a highly-doped drain 4 of the second conductivity type, in the present example n-type, are formed on opposite sides of the sidewall spacers 22 by means of a self-aligned implantation of a heavier dose of, for example, phosphorus or arsenic using the gate structure 8, the access gate 14 and the sidewall spacers 22 as a mask. The semiconductor body 1 is then subjected to a self-aligned silicide process, also referred to as salicide process, in order to provide the substantially flat surface portion 17 of the access gate 14, the source 3 and the drain 4 with the metal silicide 18, for example a titanium silicide, the result of which is shown in FIG. 1.

Finally, the semiconductor device may be completed by conventional CMOS process flow steps (not shown) for oxide deposition, contact definition and metallization with one or more metal layers.

Figure 8:
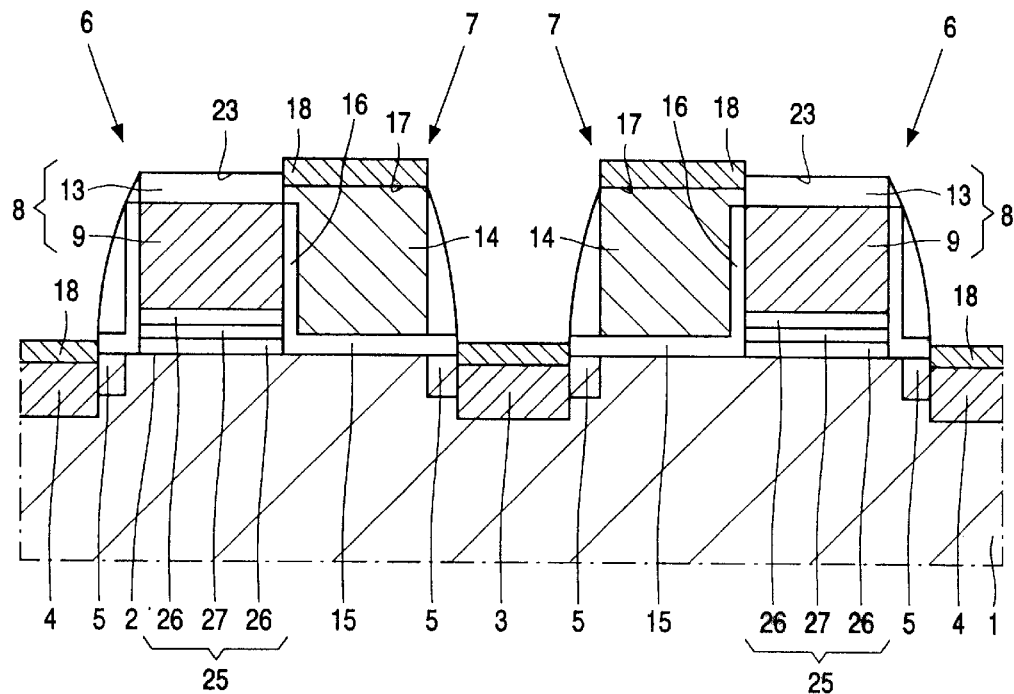
FIG. 8 shows a diagrammatic cross-sectional view of a second embodiment of adjacent non-volatile memory cells in accordance with the invention.
Figure 9:
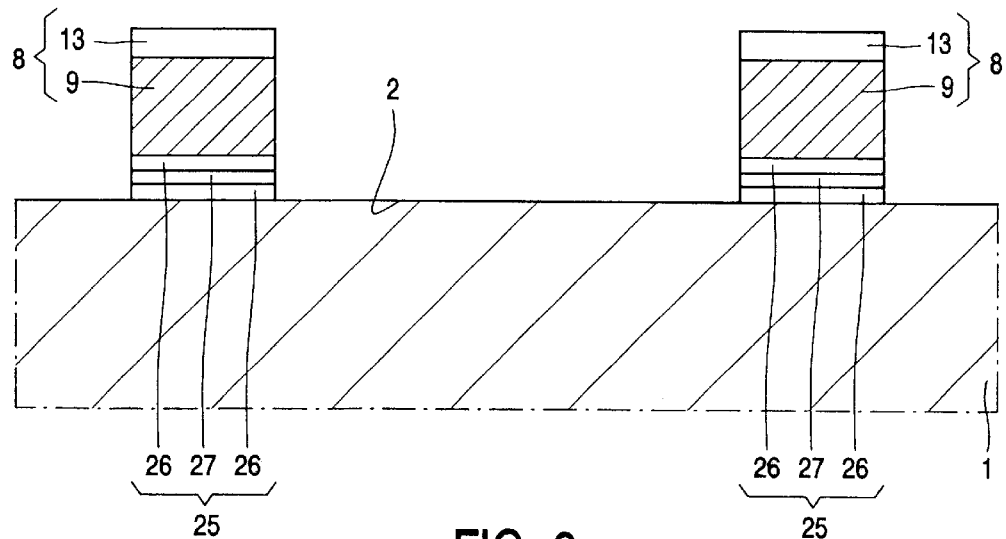
FIGS. 9 to 14 show diagrammatic cross-sectional views of successive stages in the manufacture of the adjacent non-volatile memory cells of FIG. 8 using the method in accordance with the invention.
Figure 10:
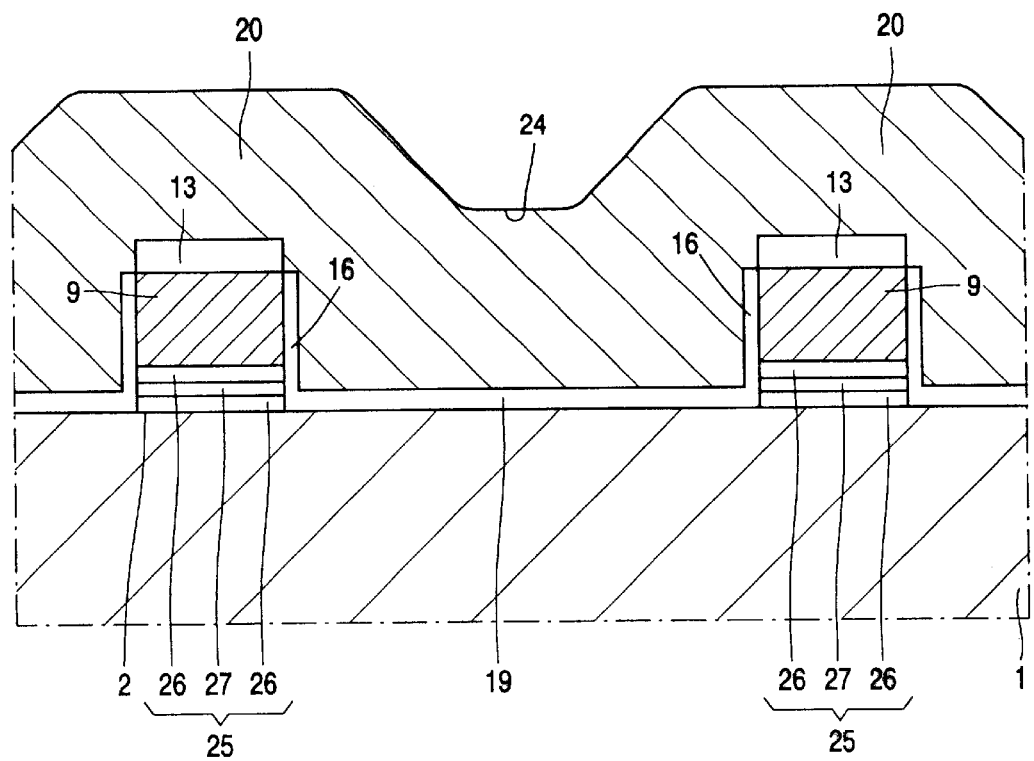

FIG. 8 shows a semiconductor body 1 of a first conductivity type, in the present example a silicon body of, for example, p-type conductivity. The semiconductor body 1 is provided at a surface 2 with non-volatile memory cells, which memory cells comprise a source 3 and a drain 4 of an opposite, second conductivity type, in the present example n-type conductivity. The source 3 and the drain 4 are provided with an extension 5 in the present example. In between the extended source 3, 5 and the extended drain 4, 5 of the memory cells the surface 2 of the semiconductor body 1 is provided with a charge trapping transistor 6 and an access transistor 7. The charge trapping transistor 6 comprises a gate structure 8, which gate structure 8 is electrically insulated from the semiconductor body 1 by a gate dielectric 25 and comprises a control gate 9. The control gate 9 can be composed of, for example, polycrystalline silicon doped with, for example, phosphorus. Alternatively, amorphous silicon or $Si_xGe_{1-x}$ may be used for the control gate 9, with x representing the fraction of silicon lying in the range between about 0.6 and 1. In the present example, the gate dielectric 25 is a stack of two silicon oxide layers 26 with a silicon nitride layer 27 in between, which stack is also referred to as ONO (oxide-nitride-oxide). At the interface between the silicon nitride layer 27 and the silicon oxide layer 26 adjacent the semiconductor body 1, a charge-storage region is present, which charge-storage region comprises a distribution of mutually separated trapping centers wherein electric charge can be stored. It will be clear that a stack of just one silicon oxide layer with a silicon nitride layer on top thereof is already sufficient to reach the same effect. Alternatively, the gate dielectric comprising the distribution of mutually separated trapping centers may, for example, be a silicon oxide layer with contaminations, for example metal particles, distributed therein. The gate structure 8 further comprises an insulating layer 13 as the uppermost layer, which insulating layer 13 is advantageously composed of silicon nitride or silicon oxide. The access transistor 7 has an access gate 14, which is electrically insulated from the semiconductor body 1 by a further gate dielectric 15. The access gate 14 can be composed of, for example, polycrystalline silicon doped with, for example, phosphorus, amorphous silicon or $Si_xGe_{1-x}$, with x representing the fraction of silicon lying in the range between about 0.6 and 1. The further gate dielectric 15 can be composed of, for example, silicon oxide, or a dielectric material whose dielectric constant is significantly higher than that of silicon oxide, such as tantalum oxide, aluminium oxide or silicon nitride. The access transistor 7 and, hence, the access gate 14 is electrically insulated from the gate structure 8 by an insulating material 16 such as, for example, silicon oxide or silicon nitride. The access gate 14 has the shape of a block which is disposed against the gate structure 8 without overlapping the gate structure 8. The access gate 14 has a substantially flat surface portion 17 extending substantially parallel to the surface 2 of the semiconductor body 1. The substantially flat surface portion 17 of the access gate 14, the source 3 and the drain 4 are provided with a metal silicide 18, for example a low ohmic phase of titanium silicide. In the present example, the substantially flat surface portion 17 of the access gate 14 is located at substantially the same height as the top surface portion 23 of the gate structure 8.

In the above-described non-volatile memory cell, the access gate 14 is provided at the side of the gate structure 8 adjacent to the source 3. Obviously, the access gate 14 may also be provided at the side of the gate structure 8 adjacent to the drain 4. Alternatively, the non-volatile memory cell may comprise two access gates instead of one, which access gates are provided at either side of the gate structure 8. A non-volatile memory cell with two access transistors is often referred to as three-transistor (3T) cell. The nonvolatile memory cell can be part of a matrix of memory cells, which matrix is embedded in a CMOS or BICMOS integrated circuit, or can be part of a stand-alone non-volatile memory.

FIGS. 9 to 14 show diagrammatic cross-sectional views of successive stages in the manufacture of the adjacent non-volatile memory cells of FIG. 8 using the method in accordance with the invention.

The manufacture starts with the semiconductor body 1 of the first conductivity type (FIG. 9), in the present example a silicon body of, for example, p-type conductivity. The semiconductor body 1 is provided at the surface 2 with the gate structure 8, which gate structure 8 is electrically insulated from the semiconductor body 1 by the gate dielectric 25. In the present example, the gate dielectric 25 is a stack of two silicon oxide layers 26 with a silicon nitride layer 27 in between, which stack is also referred to as ONO (oxide-nitride-oxide). The stack comprising the gate dielectric 25 and the gate structure 8, which comprises the control gate 9 and the insulating layer 13 as the uppermost layer, can be formed in a usual way by depositing the different layers and subsequently patterning these layers so as to form the stack.

In a next step (FIG. 10), the exposed parts of the surface 2 of the semiconductor body 1 are provided with a dielectric layer 19, providing the further gate dielectric 15 of the access transistor 7 in a later stage of the process. Then, the side wall portions of the gate structure 8 are covered with the insulating material 16 in order to electrically insulate the access gate 14, which is to be provided in a later stage of the process, from the gate structure 8. Then, a conductive layer 20 is applied in a thickness such that the upper surface 24 of the conductive layer 20 next to the gate structure 8 is located at substantially the same height as, or higher than, the top surface portion 23 of the gate structure 8.

Figure 11:
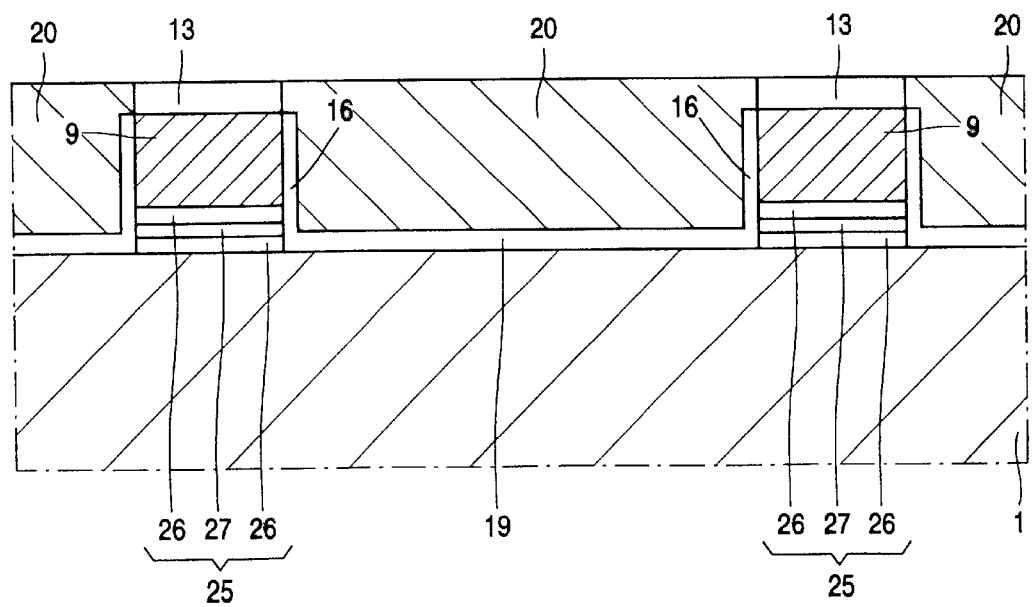
Figure 12:
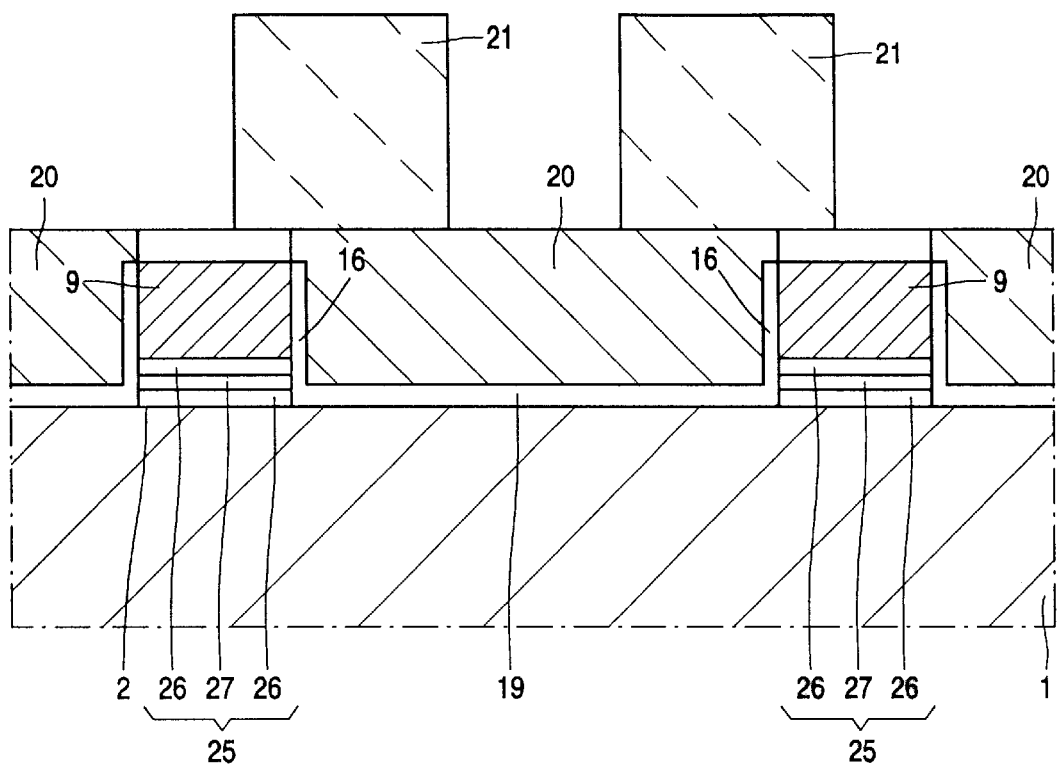
Figure 13:
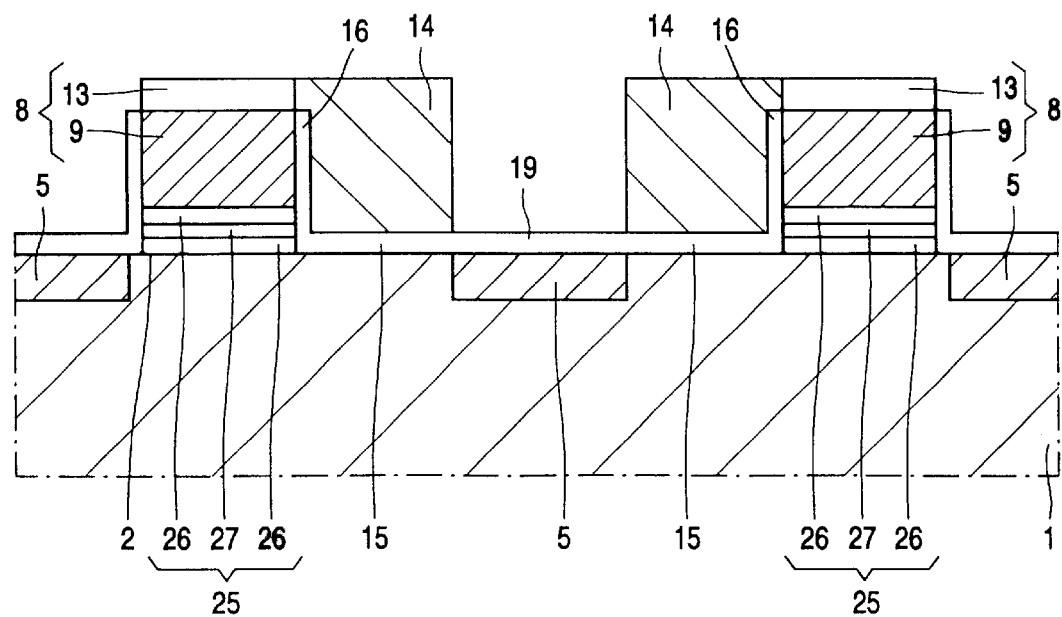

With reference to FIG. 11, the conductive layer 20 is removed over a part of its thickness by means of a planarizing treatment until the gate structure 8 is exposed. In order to accurately stop the planarizing treatment, the gate structure 8 advantageously comprises the insulating layer 13 as the uppermost layer, which insulating layer 13 is composed of a material having a larger resistance with respect to the planarizing treatment than the material used for the conductive layer 20. The insulating layer 13 acts as a stopping layer during the planarizing treatment. If polycrystalline silicon is applied for the conductive layer 20, the insulating layer 13 is advantageously formed of silicon oxide or silicon nitride. Chemical-mechanical polishing (CMP) is advantageously used to remove the conductive layer 20 over part of its thickness. For this purpose, a commercially available slurry can be used.

In a next step (FIG. 12), the conductive layer 20 is patterned, while using a mask 21 to provide the access gate 14 of the access transistor 7, which mask 21 stretches out from the gate structure 8 over a region of the conductive layer 20 adjoining the gate structure 8. The conductive layer 20 is advantageously patterned by means of photolithography. For that purpose, a photoresist layer is deposited on top of the conductive layer 20, which photoresist layer is patterned by means of exposure to light in order to form the mask 21, after which unmasked parts of the conductive layer 20 are removed. Owing to the substantially flat surface of the conductive layer 20 at the moment that the photoresist layer is patterned by means of exposure to light, the light is not reflected in oblique directions on the surface of the conductive layer 20. Hence, the access gate 14 is formed with a relatively large dimensional accuracy (FIG. 13), the access gate 14 being electrically insulated from the semiconductor body 1 by the further gate dielectric 15, which further gate dielectric 15 is provided by the dielectric layer 19. After formation of the access gate 14, the surface 2 of the semiconductor body 1 is provided with source/drain extensions 5 of the second, opposite conductivity type, in the present example n-type, by means of a self-aligned implantation of a relatively light dose of, for example, phosphorus or arsenic using the gate structure 8 together with the access gate 14 as a mask.

Figure 14:
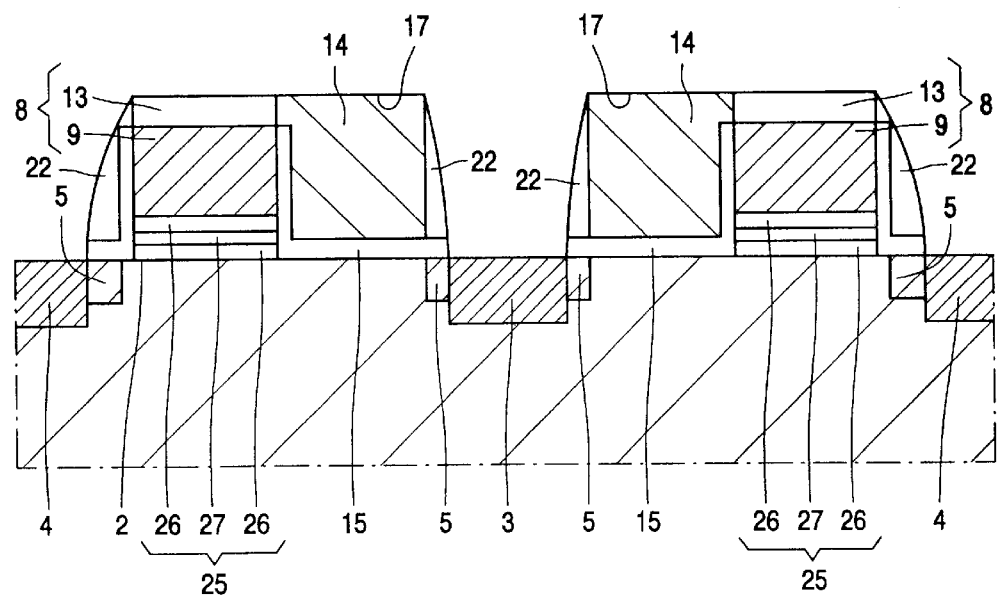

Subsequently, sidewall spacers 22 are formed e.g. in a known way, for example, by means of deposition and anisotropic etch-back of a silicon nitride layer or a silicon oxide layer (FIG. 14). After formation of the sidewall spacers 22, a highly-doped source 3 and a highly-doped drain 4 of the second conductivity type, in the present example n-type, are formed on opposite sides of the sidewall spacers 22 by means of a self-aligned implantation of a heavier dose of, for example, phosphorus or arsenic using the gate structure 8, the access gate 14 and the sidewall spacers 22 as a mask. The semiconductor body 1 is then subjected to a self-aligned silicide process, also referred to as salicide process, in order to provide the substantially flat surface portion 17 of the access gate 14, the source 3 and the drain 4 with the metal silicide 18, for example a titanium silicide, the result of which is shown in FIG. 8.

Finally, the semiconductor device may be completed by conventional CMOS process flow steps (not shown) for oxide deposition, contact definition and metallization with one or more metal layers.

It will be apparent that the invention is not limited to the embodiments described above, but that many variations are possible to those skilled in the art within the scope of the invention. For example, the source and the drain can optionally be implanted without extensions. In the above-described embodiments, the substantially flat surface portion of the access gate is located at substantially the same height as the top surface portion of the gate structure. Alternatively, the substantially flat surface portion of the access gate may be located lower or higher than the top surface portion of the gate structure. The former situation may be obtained, for example, by subjecting the conductive layer to a maskless etching treatment, which is advantageously carried out in an isotropic way, after planarizing and prior to patterning the conductive layer. The latter situation may be obtained, for example, by removing the insulating layer from the control gate after planarizing and prior to patterning the conductive layer.

What is claimed is:

1. A method of manufacturing a semiconductor device comprising a semiconductor body (1) which is provided at a surface (2) with a non-volatile memory cell, by which method a gate structure (8) comprising a control gate (7 is formed at the surface (2) of the semiconductor body (1), the gate structure (8) being electrically insulated from the semiconductor body (1) by a gate dielectric (11,25), which gate dielectric (11,25) is provided with a charge-storage region wherein data in the form of electric charge is stored, after which a conductive layer (20) is applied in a thickness such that the upper surface (24) of the conductive layer (20) next to the gate structure (8) is located at substantially the same height as, or higher than, the top surface portion (23) of the gate structure (8), which conductive layer (20) is removed over a part of its thickness by means of a planarizing treatment until the gate structure (8) is exposed, after which the conductive layer (20) is patterned, while using a mask (21) to provide an access gate (14), which mask (21) stretches out from the gate structure (8) over a region of the conductive layer (20) adjoining the gate structure (8).

2. A method as claimed in claim 1, wherein the mask (21) is applied by depositing a photoresist layer, which photoresist layer is patterned by means of exposure to light.

3. A method a claim 1, wherein, after the provision of the access gate (14), the surface (2) of the semiconductor body (1) is provided with a source (3) and a drain (4), while using the gate structure (8) an the access gate (14) as a mask.

4. A method as claimed in claim 1, wherein the gate structure (8) is provided with an insulating layer (13) as the uppermost layer, which insulating layer (13) is composed of a material having a larger resistance with respect to the planarizing treatment than the material used for the conductive layer (20).

5. A method as claimed in claim 4, wherein silicon oxide or silicon nitride is applied as the insulating layer and the conductive layer is applied by depositing a layer of polycrystalline silicon.

6. A method as claimed in claim 1, wherein chemical-mechanical polishing (CMP) is applied as the planarizing treatment.

* * * * *